United States Patent
He et al.

(10) Patent No.: US 11,035,896 B2
(45) Date of Patent: Jun. 15, 2021

(54) METHOD AND DEVICE FOR RELIABILITY ASSESSMENT OF WIDE AREA PROTECTION SYSTEM

(71) Applicant: GUANGDONG UNIVERSITY OF TECHNOLOGY, Guangzhou (CN)

(72) Inventors: Ruiwen He, Guangzhou (CN); Hao Peng, Guangzhou (CN); Jing Zhong, Guangzhou (CN); Jianhua Deng, Guangzhou (CN)

(*) Notice: Subject to any disclaimer, the term of this patent is extended or adjusted under 35 U.S.C. 154(b) by 168 days.

(21) Appl. No.: 16/390,002

(22) Filed: Apr. 22, 2019

(65) Prior Publication Data

US 2019/0361065 A1    Nov. 28, 2019

Related U.S. Application Data

(63) Continuation of application No. PCT/CN2018/099335, filed on Aug. 8, 2018.

(51) Int. Cl.
    *G01R 31/08*    (2020.01)

(52) U.S. Cl.
    CPC ............... *G01R 31/086* (2013.01)

(58) Field of Classification Search
    CPC ........... G01R 31/086; G01R 19/2513; G01R 31/088; G01R 35/005; Y04S 40/20;
    (Continued)

(56) References Cited

U.S. PATENT DOCUMENTS 9,686,125 B2    6/2017 Smith et al.
10,338,127 B2 * 7/2019 Hao ................ G01R 31/088
(Continued)

FOREIGN PATENT DOCUMENTS

CN    102570426 A    7/2017
CN    107634844 A    1/2018
JP       5060360 B2   10/2012

OTHER PUBLICATIONS

Mehr, development and verification of control and protection strategies in hybrid ac/dc power systems for smart grid applications (Year: 2012).*
(Continued)

*Primary Examiner* — Mohammad K Islam
(74) *Attorney, Agent, or Firm* — Erson IP (Nelson IP)

(57) ABSTRACT

The disclosure provides a method and device for reliability assessment of a wide area protection system, solving the technical problem that a reliability research result of a current wide area protection system is only limited to reliability research of a communication network thereof, but a reliability analysis model for an overall system does not exist. The method provided by the disclosure includes: S1, acquiring an information acceptance rate d of a wide area monitoring center of a wide area protection system; S2, obtaining the accuracy $p_{sf}(d)$ of wide area protection initiation, the accuracy $p_{fa}(d)$ of fault area positioning and the accuracy $p_{fc}(d)$ of fault element recognition according to the information acceptance rate d; and S3, multiplying the accuracy $p_{sf}(d)$ of wide area protection initiation, the accuracy $p_{fa}(d)$ of fault area positioning and the accuracy $p_{fc}(d)$ of fault element recognition to obtain the decision accuracy $P_{dmp}$ of the wide area protection system.

10 Claims, 8 Drawing Sheets

(58) Field of Classification Search
CPC .... Y04S 10/52; Y04S 20/00; H02J 13/00034; H02J 13/00002; H02J 13/0075; H02J 3/24
See application file for complete search history.

(56) References Cited

U.S. PATENT DOCUMENTS

| | | | | |
|---|---|---|---|---|
| 10,756,543 | B2* | 8/2020 | Detmers | H02J 7/04 |
| 10,830,807 | B2* | 11/2020 | Ha | G01R 31/086 |
| 2005/0102571 | A1 | 5/2005 | Peng et al. | |
| 2011/0282508 | A1* | 11/2011 | Goutard | H04L 63/20 |
| | | | | 700/293 |
| 2013/0018515 | A1 | 1/2013 | Majumder | |
| 2014/0070617 | A1* | 3/2014 | Detmers | H02J 3/00 |
| | | | | 307/64 |
| 2014/0300210 | A1* | 10/2014 | Abi-Ackel | H04Q 9/00 |
| | | | | 307/130 |
| 2015/0346123 | A1* | 12/2015 | Hoffmann | H02S 50/00 |
| | | | | 324/71.1 |
| 2015/0346240 | A1* | 12/2015 | Gunn | G01R 15/06 |
| | | | | 324/127 |
| 2016/0248254 | A1* | 8/2016 | Huomo | H02J 13/0006 |
| 2017/0052222 | A1* | 2/2017 | Pasdar | H01H 47/00 |
| 2018/0247001 | A1* | 8/2018 | Liu | G06F 16/955 |
| 2018/0254662 | A1* | 9/2018 | Golshani | H02J 13/00018 |
| 2018/0267094 | A1* | 9/2018 | Moertl | B60L 3/0069 |
| 2018/0275711 | A1* | 9/2018 | Johnson | G05F 5/00 |
| 2019/0027962 | A1* | 1/2019 | Buhagiar | G05B 19/042 |
| 2019/0059111 | A1* | 2/2019 | Zhang | H04W 52/18 |
| 2019/0331726 | A1* | 10/2019 | Ha | G01R 31/083 |
| 2019/0357150 | A1* | 11/2019 | Wang | H04W 52/325 |
| 2020/0293627 | A1* | 9/2020 | Wang | G06F 30/20 |
| 2021/0029650 | A1* | 1/2021 | Cirik | H04W 52/248 |

OTHER PUBLICATIONS

Zhang et al., Propagation Delay Measurement and Compensation for Sampled Value Synchronization in a Smart Substation (Year: 2017).*

* cited by examiner

METHOD AND DEVICE FOR RELIABILITY ASSESSMENT OF WIDE AREA PROTECTION SYSTEM

CROSS-REFERENCE TO RELATED APPLICATIONS

This application is a continuation of International Patent Application No. PCT/CN2018/099335 with a filing date of Aug. 8, 2018, designating the United States, now pending, and further claims priority to Chinese Patent Application No. 201810496366.0 with a filing date of May 22, 2018. The content of the aforementioned applications, including any intervening amendments thereto, are incorporated herein by reference.

TECHNICAL FIELD

The disclosure relates to the technical field of relay protection, and particularly relates to a method for reliability assessment of a wide area protection system.

BACKGROUND OF THE PRESENT INVENTION

With the rapid growth of electric power demand, increasing extended transmission and distribution power network makes a network architecture of an electric power system more complicated, renders operation modes to be more flexible, causes relay protection setting to be more difficult or even difficultly coordinated, and a large scale of blackout accidents triggered by incorrect actions of a traditional relay protection device based on local information often occur. In order to improve the property of a relay protection system, the concept of a wide area protection system correspondingly arises. In recent years, with the rapid development of a wide area communication network technology and intelligent electronic equipments, achievement of the wide area protection system has ready to go. However, different from the traditional substation relay protection system, a wide area protection system is built on an information network, its accuracy of recognizing and isolating fault elements is inseparable from an effectiveness of uploading wide area electricity information distributed in different geographic positions to a monitoring center. In brief, the wide area protection system has strong dependence on a wide area information flow, apparently, is a cyber-physical system. Thus, it is urgent to research on how to undergo reliability modeling and analysis of such novel system.

The reliability research results of the current wide area protection system are only limited to reliability research of its communication network, but a reliability analysis model of an overall system does not exist.

SUMMARY OF PRESENT INVENTION

The disclosure provides a method for reliability assessment of a wide area protection system, solving the technical problem that the reliability research results of the current wide area protection system are only limited to reliability research of its communication network, but a reliability analysis model of an overall system does not exist.

The disclosure provides a method for reliability assessment of a wide area protection system, including:

S1, acquiring an information acceptance rate d of a wide area monitoring center of a wide area protection system;

S2, obtaining the accuracy $p_{sf}(d)$ of wide area protection initiation, the accuracy $p_{fz}(d)$ of fault area positioning and the accuracy $p_{fc}(d)$ of fault element recognition according to the information acceptance rate d; and S3, multiplying the accuracy $p_{sf}(d)$ of wide area protection initiation, the accuracy $p_{fz}(d)$ of fault area positioning and the accuracy $p_{fc}(d)$ of fault element recognition to obtain the decision accuracy $P_{dmp}$ of the wide area protection system.

Optionally, after the step S3, also including:

S4, acquiring the accuracy $P_{sub}^i$ of an action of a relay protection device of the $i^{th}$ substation in a regional power grid during steady-state operation; and S5, combining the decision accuracy $P_{dmp}$ of the wide area protection system and the accuracy $P_{sub}^i$ of an action of a relay protection device of the $i^{th}$ substation in a regional power grid during steady-state operation, and calculating to obtain the probability $p_{act}$ of the reliable action of the wide area protection system.

Optionally, the step S5 specifically includes:

calculating through a first preset formula $$P_{act} = P_{dmp} \prod_i p_{sub}^i$$

to obtain the probability $p_{act}$ of the reliable action of the wide area protection system.

Optionally, the step S2 specifically includes:

S21, acquiring the theoretical quantity of bus sequence voltage information uploaded by various substations in the regional power grid to the wide area monitoring center;

S22, acquiring a set of bus sequence voltages received by the wide area monitoring center and uploaded by various substations in the regional power grid;

S23, determining a set of suspected fault buses, whose sequence voltages are less than a preset bus sequence voltage initiation setting value, in a set of bus sequence voltages received by the wide area monitoring center according to the preset bus sequence voltage initiation setting value in the wide area monitoring center, and accounting the quantity of the suspected fault buses; and S24, calculating the accuracy $p_{sf}(d)$ of wide area protection initiation in combination with the information acceptance rate d, the theoretical quantity of bus sequence voltage information uploaded by various substations in the regional power grid to the wide area monitoring center and the quantity of the suspected fault buses.

Optionally, after the step S23, also including:

S25, using the set of the suspected fault buses and elements connected with outgoing lines of the suspected fault buses as a fault area ˆ;

S26, determining a possible quantity set of bus sequence voltages corresponding to at least one port of each element in the fault area ˆ and being less than the preset bus sequence voltage initiation setting value; and S27, calculating the accuracy $p_{fz}(d)$ of fault area positioning in combination with the information acceptance rate d, the theoretical quantity of bus sequence voltage information uploaded by various substations in the regional power grid to the wide area monitoring center and the possible quantity set of bus sequence voltages corresponding to at least one port of each element in the fault area ˆ and being less than the preset bus sequence voltage initiation setting value.

Optionally, after the step S25, also including:

S28, acquiring the theoretical quantity $Q^0$ of power direction information uploaded by all the suspected fault elements in the fault area ^ to the wide area monitoring center; and S29, calculating the accuracy $p_{fc}(d)$ of recognizing the fault elements in the fault area ^ in combination with the information acceptance rate d and the theoretical quantity $Q^0$ of power direction information uploaded by all the suspected fault elements in the fault area ^ to the wide area monitoring center.

Optionally, the step S24 specifically includes:

calculating the accuracy of wide area protection initiation through a second preset formula $$P_{sf} = \begin{cases} 0, S = 0 \\ \dfrac{\sum_{i=1}^{\Upsilon\delta} C_{S^0-i}^{S-1}}{C_{S^0}^{S}}, 0 < S < S^0 - \Upsilon\delta + 1 \\ 1, S^0 - \Upsilon\delta + 1 \leq S \leq S^0 \end{cases},$$

wherein, in the formula, $S^0 = \delta \text{card}(U_{(1)}^+)$ is the theoretical quantity of bus sequence voltage information uploaded by various substations in the regional power grid to the wide area monitoring center; $\delta$ is redundancy of information; the symbol card(g) is used for describing a cardinal number of a set; $S = \lfloor S^0 d \rfloor$ is an actual quantity of the bus sequence voltage information uploaded by various substations in the regional power grid and received by the wide area monitoring center, $S \in N$, and $S \propto d$; the symbol $\lfloor \ \rfloor$ is a floor function; $\Upsilon$ is a quantity of suspected fault buses.

Optionally, the step S27 specifically includes:

calculating the accuracy of fault area positioning through a third preset formula $$P_{fz} = \begin{cases} 0, S = 0 \\ \dfrac{\sum_{i=1}^{\alpha\delta} C_{S^0-i}^{S-1}}{\sum_{i=1}^{\Upsilon\delta} C_{S^0-i}^{S-1}}, 0 < S < S^0 - \alpha\delta + 1 \\ 1, S^0 - \alpha\delta + 1 \leq S \leq S^0 \end{cases},$$

wherein, in the formula, $S^0 = \delta \text{card}(U_{(1)}^+)$ is the theoretical quantity of bus sequence voltage information uploaded by various substations in the regional power grid to the wide area monitoring center; $\delta$ is redundancy of information; the symbol card(g) is used for describing a cardinal number of a set; $S = \lfloor S^0 d \rfloor$ is an actual quantity of the bus sequence voltage information uploaded by various substations in the regional power grid and received by the wide area monitoring center, $S \in N$ and $S \propto d$; the symbol $\lfloor \ \rfloor$ is a floor function; $\alpha \in \{1, 2\}$ is the possible quantity set of bus sequence voltages corresponding to at least one port of each element in the fault area ^ and being less than the preset bus sequence voltage initiation setting value.

Optionally, the step S29 specifically includes:

calculating the accuracy of recognizing fault elements in the fault area ^ through a fourth formula $$P_{fc} = \begin{cases} 0, 0 \leq Q < 2 \\ 1 - \dfrac{2\sum_{i=0}^{Q} C_\delta^i C_{Q^0-2\delta}^{Q-i} - C_{Q^0-2\delta}^{Q}}{C_{Q^0}^{Q}}, 2 \leq Q < \delta \\ 1 - \dfrac{2\sum_{i=0}^{\delta} C_\delta^i C_{Q^0-2\delta}^{Q-i} - C_{Q^0-2\delta}^{Q}}{C_{Q^0}^{Q}}, \delta \leq Q \leq Q^0 < 2\delta \\ 1 - \dfrac{2\sum_{i=\beta}^{\delta} C_\delta^i C_{Q^0-2\delta}^{Q-i}}{C_{Q^0}^{Q}}, Q^0 - 2\delta < Q \leq Q^0 - \delta \\ 1, Q^0 - \delta < Q \leq Q^0 \end{cases},$$

wherein, in the formula, $Q^0 = n\delta \text{card}(C)$ is the theoretical quantity of power direction information uploaded by all the suspected fault elements in the fault area ^, to the wide area monitoring center, and n is a number of ports of suspected fault elements; $\delta$ is redundancy of information; the card(g) is used for describing a cardinal number of a set of suspected fault elements; $Q = \lfloor Q^0 d \rfloor$ is an actual quantity of power direction information uploaded by all the suspected fault elements and received by the wide area monitoring center, and the symbol $\lfloor \ \rfloor$ is a floor function; $\beta = Q - (Q_0 - 2\delta)$.

The disclosure provides a device for reliability assessment of a wide area protection system, including:

an acquiring unit configured to acquire an information acceptance rate d of a wide area monitoring center of a wide area protection system;

a first calculation unit configured to obtain the accuracy $p_{sf}(d)$ of wide area protection initiation, the accuracy $p_{fz}(d)$ of fault area positioning and the accuracy $p_{fc}(d)$ of fault element recognition according to the information acceptance rate d; and a second calculation unit configured to multiply the accuracy $p_{sf}(d)$ of wide area protection initiation, the accuracy $p_{fz}(d)$ of fault area positioning and the accuracy $P_{fc}(d)$ of fault element recognition to obtain the decision accuracy $P_{dmp}$ of the wide area protection system.

It can be seen from the above technical solution that the disclosure has the following beneficial effects:

The disclosure provides a method for reliability assessment of a wide area protection system, including: S1, acquiring an information acceptance rate d of a wide area monitoring center of a wide area protection system; S2, obtaining the accuracy $p_{sf}(d)$ of wide area protection initiation, the accuracy $p_{fz}(d)$ of fault area positioning and the accuracy $P_{fc}(d)$ of fault element recognition according to the information acceptance rate d; and S3, multiplying the accuracy $p_{sf}(d)$ of wide area protection initiation, the accuracy $p_{fz}(d)$ of fault area positioning and the accuracy $p_{fc}(d)$ of fault element recognition to obtain the decision accuracy $P_{dmp}$ of the wide area protection system.

According to the disclosure, the reliability of the wide area protection system is analyzed from three steps of protection initiation, fault area positioning and fault element recognition, the wide area communication system is described with an information flow model, and on that basis, the decision accuracy of the wide area protection system is calculated to form a complete wide area protection reliability analysis model. A modeling method deeply combining an information flow and a protection algorithm expands the traditional reliability assessment considering the functional failure of the system caused by mechanical levels of various devices, can provide a new thinking for reliability assessment of other cyber-physical systems of a future more intelligent power grid, and solves the technical problem that the reliability research results of the current wide area protection system are only limited to reliability research of a communication network thereof, but a reliability analysis model of an overall system does not exist.

DESCRIPTION OF THE DRAWINGS

In order to make the technical solutions in embodiments of the disclosure or in the prior art described more clearly, the drawings needing to be used in the embodiments or the prior art will be illustrated concisely hereinafter. Obviously, the drawings described below are only some embodiments according to the disclosure. Numerous drawings therein will be apparent to one of ordinary skill in the art based on the drawings described in the disclosure without creative efforts.

DETAILED DESCRIPTION OF PREFERRED EMBODIMENTS

Embodiments of the disclosure provide a method for reliability assessment of a wide area protection system, solving the technical problem that the reliability research results of the current wide area protection system are only limited to reliability research of a communication network thereof, but a reliability analysis model of an overall system does not exist.

In order to make the objects, features and advantages of the disclosure more clear and more easily understandable, the technical solutions in embodiments of the disclosure will be clearly and completely described in combination with drawings in embodiments of the disclosure, apparently, the embodiments described below are only one part of embodiments according to the disclosure rather than all the embodiments. Based on embodiments of the disclosure, all the other embodiments obtained by ordinary skill in the art without any creative efforts belong to the protection scope of the disclosure.

Figure 1:
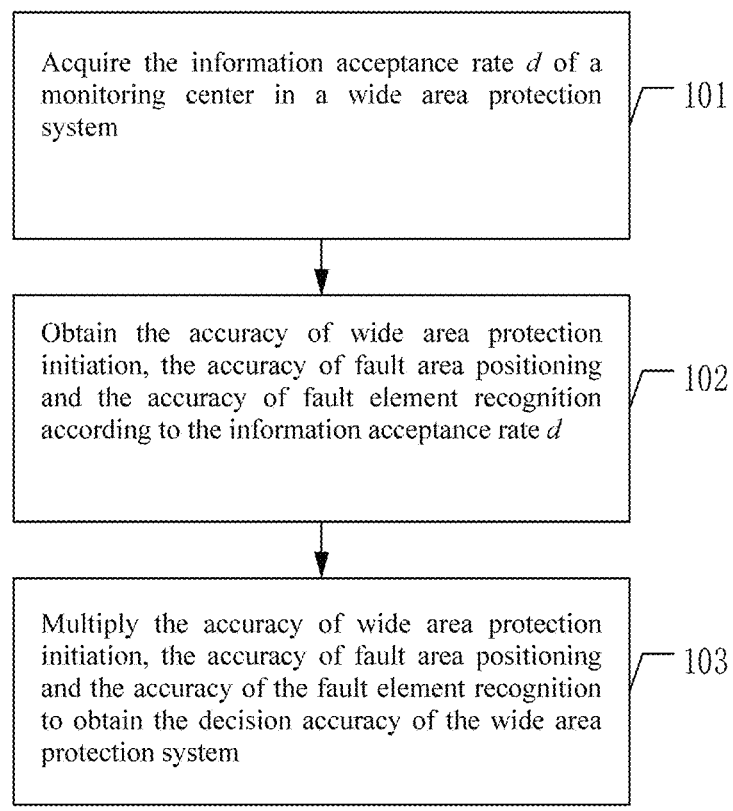
FIG. 1 is a flow chart of an embodiment of a method for reliability assessment of a wide area protection system according to the disclosure.

Referring to FIG. 1, the disclosure provides a method for reliability assessment of a wide area protection system according to an embodiment, including:

101, acquiring an information acceptance rate d of a wide area monitoring center of a wide area protection system;

102, obtaining the accuracy $p_{sf}(d)$ of wide area protection initiation, the accuracy $p_{fz}(d)$ of fault area positioning and the accuracy $P_{fc}(d)$ of fault element recognition according to the information acceptance rate d; and 103, multiplying the accuracy $p_{sf}(d)$ of wide area protection initiation, the accuracy $p_{fz}(d)$ of fault area positioning and the accuracy $P_{fc}(d)$ of fault element recognition to obtain the decision accuracy $P_{dmp}$ of the wide area protection system.

Figure 4:
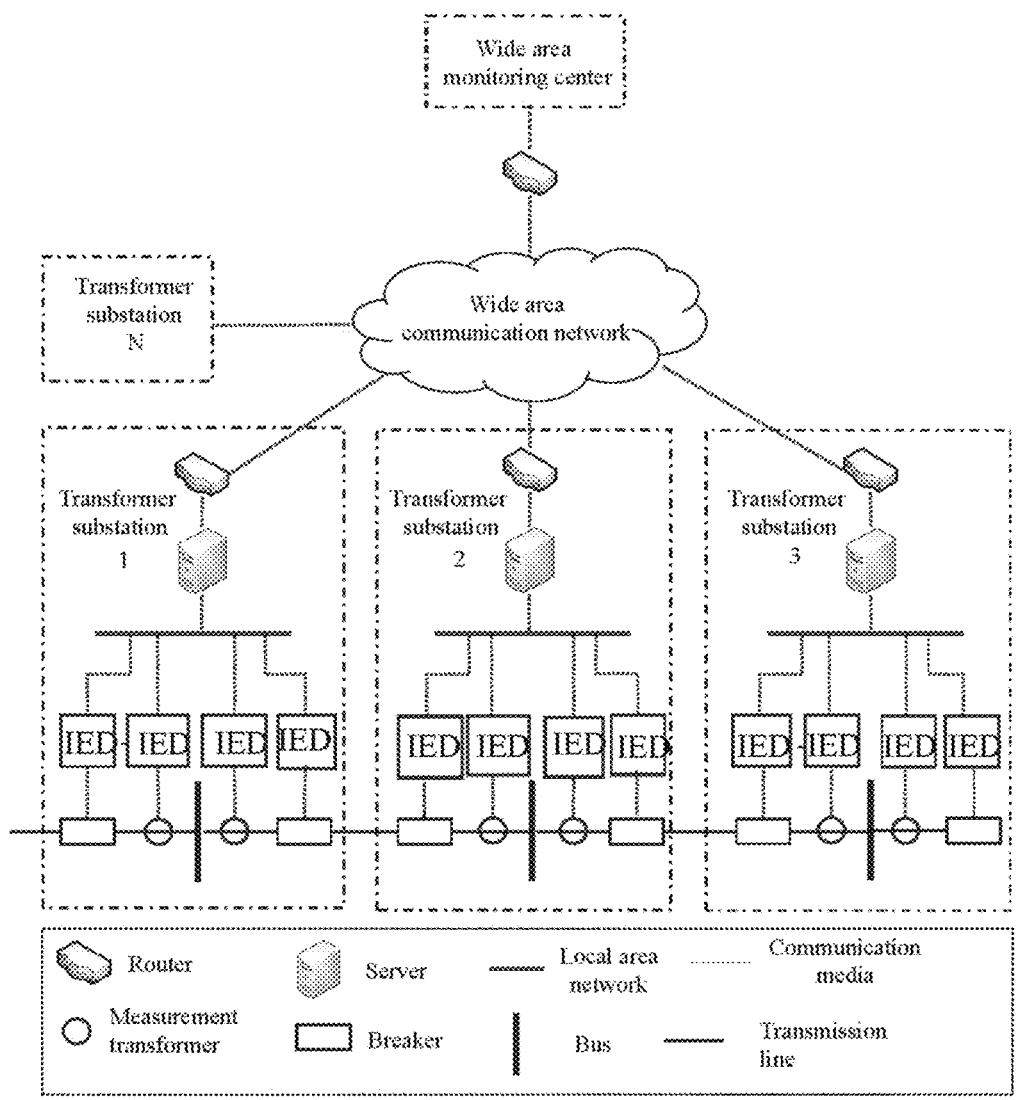
FIG. 4 is a structural diagram of a wide area protection system.

It should be noted that as shown in FIG. 4, FIG. 4 is a structural diagram of a wide area protection system. In this structural drawing, intelligent electronic devices (IED) on bottom layers of various substations are responsible for collecting information such as an analog quantity and a switching value at an installation position, then the collected information is integrated to a substation server through a local area network of a substation and uploaded to a wide area monitoring center of a master station through a wide area communication network. Further, the monitoring center recognizes fault elements through the wide area information collected by various substations.

When a failure occurs in the regional power grid, the wide area monitoring center can correctly recognize the fault elements from the collected limited wide area information in time.

Figure 5:
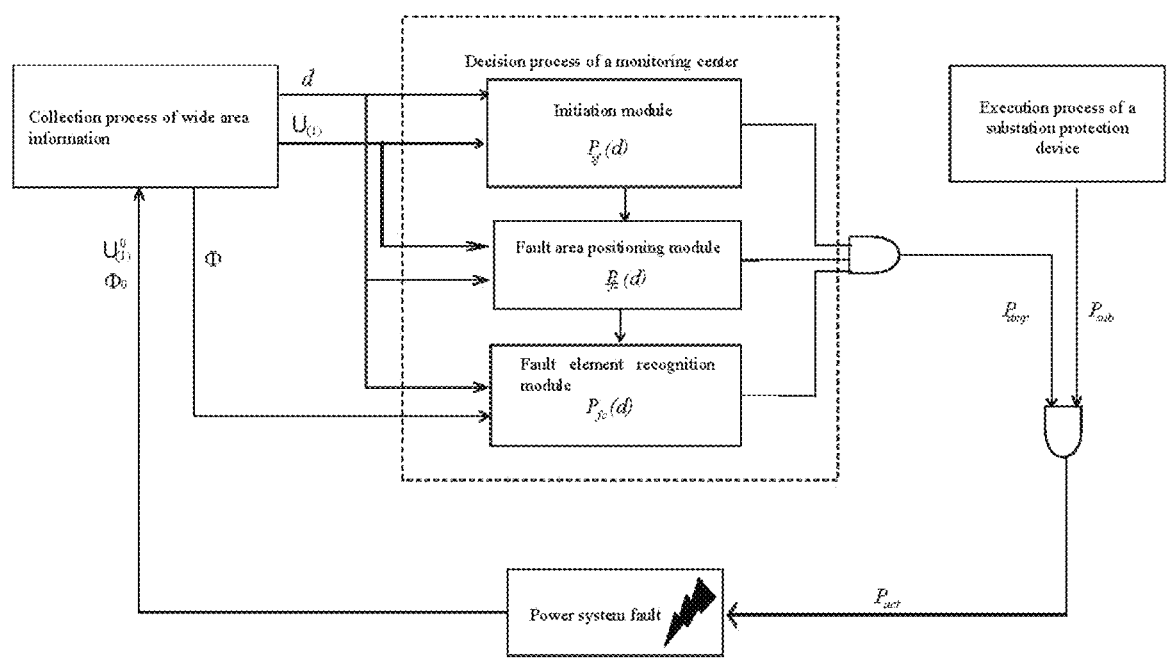
FIG. 5 is a frame diagram of a reliability assessment model of a wide area protection system according to the disclosure.
Figure 6:
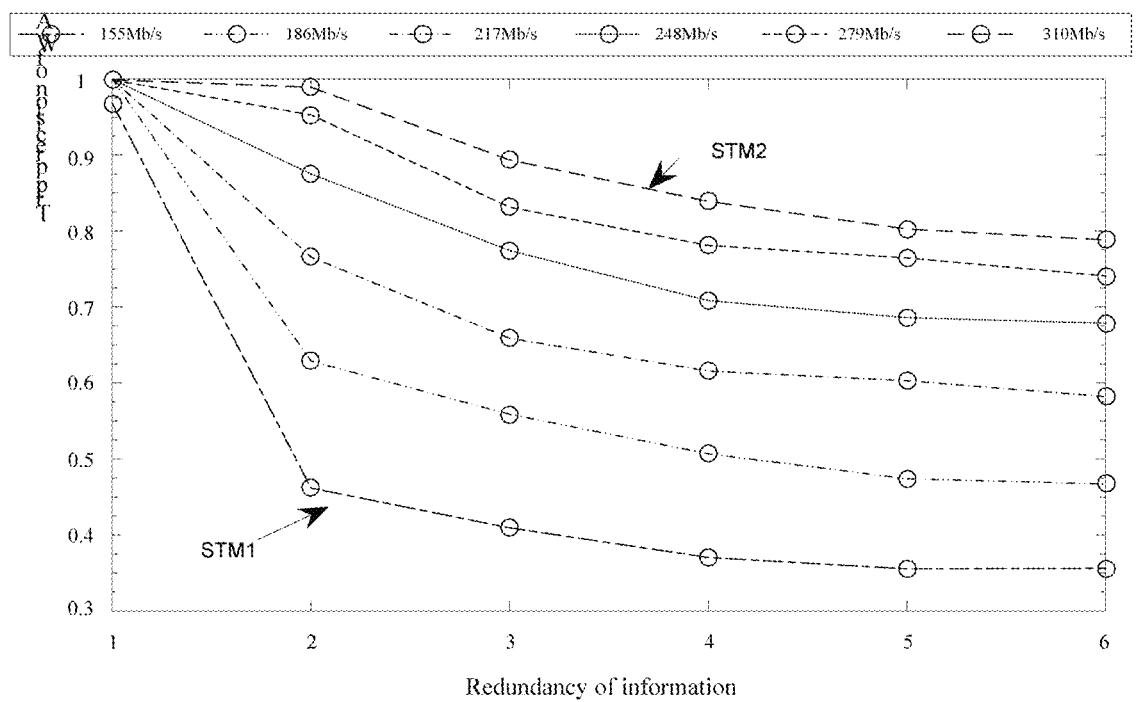
FIG. 6 shows the accuracy of an action of a wide area protection system under different scenarios.
Figure 7:
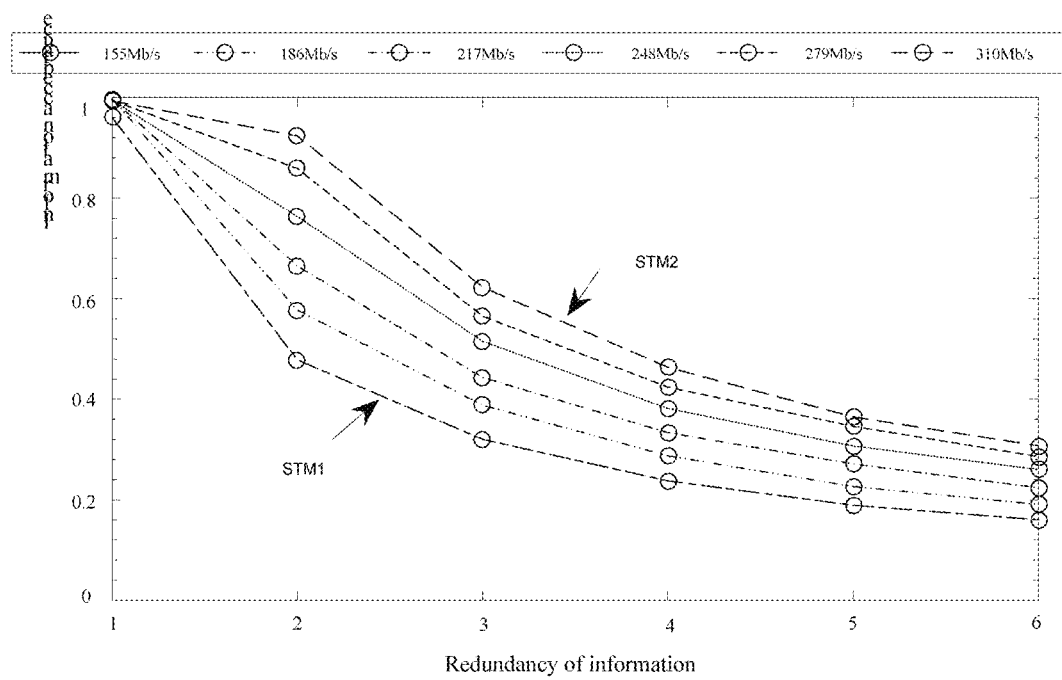
FIG. 7 shows an information acceptance rate of a wide area communication system under different scenarios.
Figure 8:
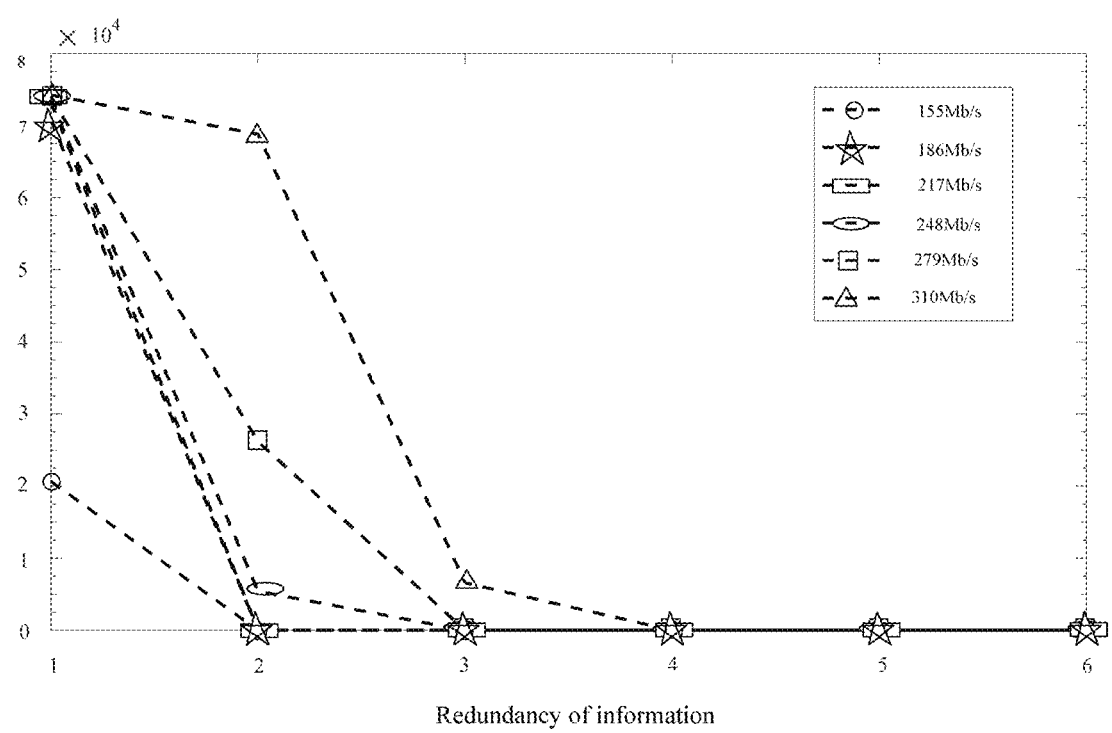
FIG. 8 shows an average available time of a wide area protection system under different scenarios.

A protection algorithm based on a direction comparison theory is adopted in the decision process. As shown in FIG. 5, when the failure occurs, various substations upload key information, such as a bus positive sequence voltage $U_{(1)}^0$ and a power direction angle $\Phi^0$ of a correlated power transmission line, required for protection decision to a master station. The information acceptance rate d reflects communication network performances under different scenarios. Further, sequence voltage information and a direction angle information actually received by the master station may be solved as $U_{(1)}$, $\Phi$.

In the face of limited collected information, the probability of correctly recognizing the fault elements in the protection decision process is not only related to d, but also depends on an algorithm adopted by wide area protection. The algorithm of the protection includes the following three modules: an initiation module, a fault area positioning module and a fault element recognition module, correspondingly, the accuracy of an action of an initiation module is $p_{sf}(d)$, the accuracy of an action of a fault area positioning module is $p_{fz}(d)$, and the accuracy of an action of a fault element recognition module is $p_{fc}(d)$. Only when all of the initiation module, the fault area positioning module and the fault element recognition module reliably operate, the decision process of wide area protection is reliable, and thus the accuracy of the decision process of the monitoring center of the wide area protection master station is $P_{dmp}=P_{sf}(d)\cdot P_{fz}(d)\cdot P_{fc}(d)$.

In embodiments of the disclosure, the reliability of the wide area protection system is analyzed from three steps of protection initiation, fault area positioning and fault element recognition, the wide area communication system is described with an information flow model, and on that basis, the decision accuracy of the wide area protection system is calculated to form a complete wide area protection reliability analysis model. A modeling method deeply combining an information flow and a protection algorithm expands a traditional reliability assessment considering the functional failure of the system caused by mechanical levels of various devices, can provide a new thinking for reliability assessment of other cyber-physical systems of a future more smart power grid, and solves the technical problem that the reliability research results of the current wide area protection system are only limited to reliability research of a communication network thereof, but a reliability analysis model of an overall system does not exist.

The above is description of one embodiment of a method for reliability assessment of a wide area protection system provided by the disclosure. Another embodiment of a method for reliability assessment of a wide area protection system provided by the disclosure will be described below.

Figure 2:
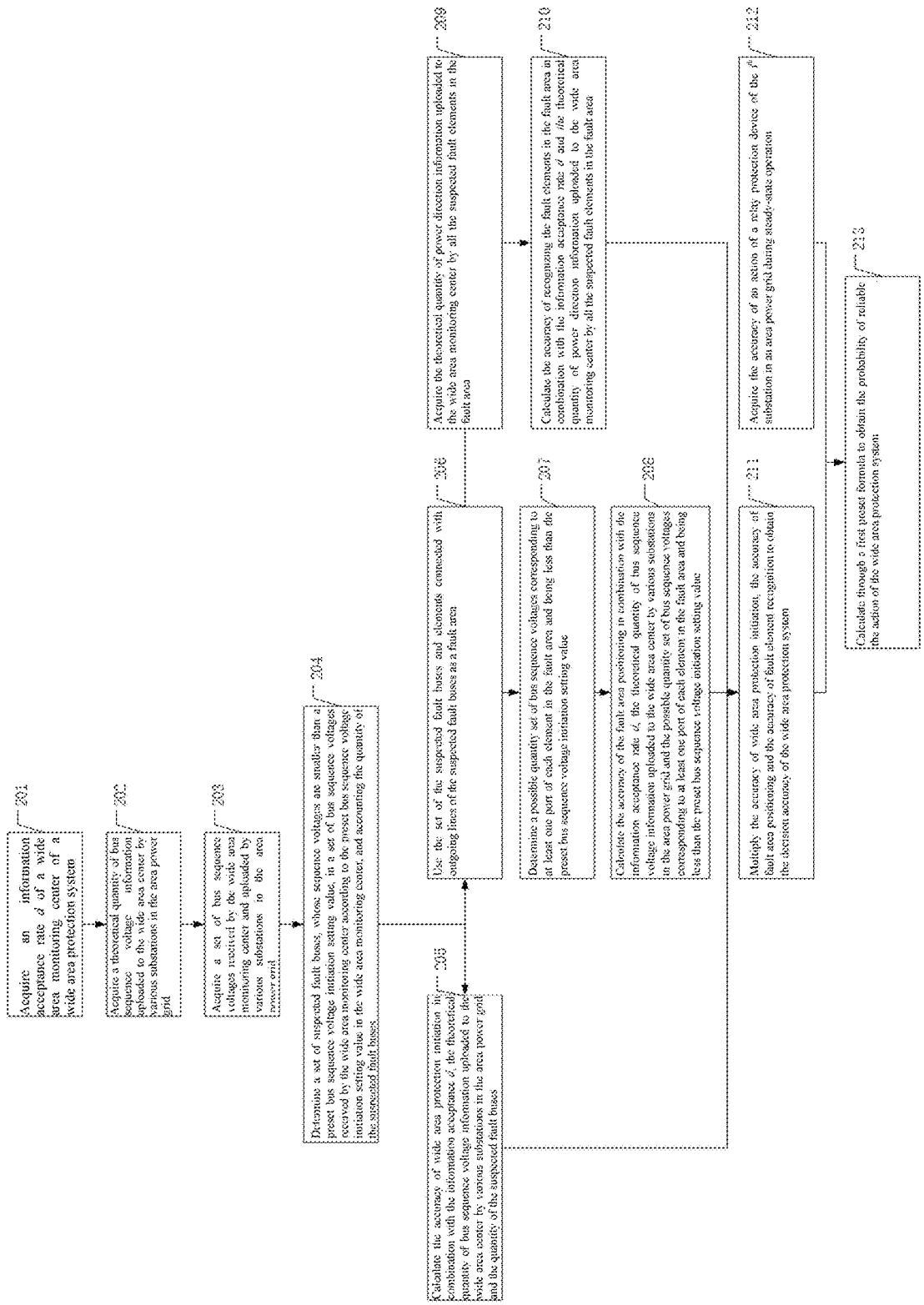
FIG. 2 is a flow chart of another embodiment of a method for reliability assessment of a wide area protection system according to the disclosure.

Referring to FIG. 2, the disclosure provides a method for reliability assessment of a wide area protection system according to another embodiment, including:

201, acquiring an information acceptance rate d of a wide area monitoring center of a wide area protection system;

202, acquiring the theoretical quantity of bus sequence voltage information uploaded by various substations in the regional power grid to the wide area monitoring center;

203, acquiring a set of bus sequence voltages received by the wide area monitoring center and uploaded by various substations in the regional power grid;

204, determining a set of suspected fault buses, whose sequence voltages are smaller than a preset bus sequence voltage initiation setting value, in a set of bus sequence voltages received by the wide area monitoring center according to the preset bus sequence voltage initiation setting value in the wide area monitoring center, and accounting the quantity of the suspected fault buses; and 205, calculating the accuracy $p_{sf}(d)$ of wide area protection initiation in combination with the information acceptance rate d, the theoretical quantity of bus sequence voltage information uploaded by various substations in the regional power grid to the wide area monitoring center and the quantity of the suspected fault buses.

Specifically, including:

calculating the accuracy of wide area protection initiation through a second preset formula $$P_{sf} = \begin{cases} 0, S = 0 \\ \dfrac{\sum_{i=1}^{\Upsilon\delta} C_{S^0-i}^{S-1}}{C_{S^0}^{S}}, 0 < S < S^0 - \Upsilon\delta + 1 \\ 1, S^0 - \Upsilon\delta + 1 \leq S \leq S^0 \end{cases},$$

wherein, in the formula, $S^0 = \delta\mathrm{card}(U_{(1)}^+)$ is the theoretical quantity of bus sequence voltage information uploaded by various substations in the regional power grid to the wide area monitoring center; $\delta$ is redundancy of information; the symbol card(g) is used for describing a cardinal number of a set; $S = \lfloor S^0 d \rfloor$ is an actual quantity of the bus sequence voltage information uploaded by various substations in the regional power grid and received by the wide area monitoring center, $S \in N$, and $S \propto d$; the symbol $\lfloor \ \rfloor$ is a floor function; $\Upsilon$ is a quantity of suspected fault buses.

It should be noted that when an electric transmission line failure occurs, a sequence voltage has significant distribution characteristics. The closer to the fault point, the lower the positive voltage of each bus is, the larger the negative sequence and zero sequence voltages. Based on this characteristic, the wide area monitoring center may acquire whether a fault occurs in regional power grid currently only when various bus sequence voltages received are compared with an initiation preset value, and consequently, it may be used as a basis of wide area protection initiation. However, none of various substations cannot timely upload three-sequence voltages to the monitoring center due to limitation and economy of a bandwidth of a wide area communication system. For this, considering that a negative sequence component cannot reflect a short-circuit failure of three-phase symmetry, a zero sequence component can only reflect a grounded short-circuit failure, while a positive sequence component may be used as an initiation reference of wide area protection because it can reflect all kinds of short-circuit failure types.

If a set of original bus sequence voltages uploaded by various substations in the regional power grid is set as $U_{(1)}^0 = \{U_1, U_2, \ldots, U_n\}$, a set of bus sequence voltages received actually by the wide area monitoring center is set as $U_{(1)} \subseteq U_{(1)}^0$, a preset initiation setting value of the wide area monitoring center is set as $U_{set}$, and a protection initiation determination function is $$h(U_{(1)}) = \begin{cases} 1, & |\min\{U_{(1)}\}| \leq U_{set} \\ 0, & \text{otherwise} \end{cases};$$

Under the ideal operation state of the system, the positive sequence voltage of the bus closest to a fault point is the lowest, but during actual operation, it is possible that more than one bus voltage meets initiation conditions even though single failure occurs due to factors such as system oscillation, power flow transfer and measurement error. A function $h(U_{(1)})$ indicates that when the failure occurs, protection can be initiated as long as at least one bus sequence voltage existing in the set $U_{(1)}$ is less than the preset initiation setting value no matter how many nodes of bus sequence voltages in $U_{(1)}^0$ meet the initiation conditions. Accordingly, when the wide area communication system is in a state Y, under the condition that the information acceptance rate is d, the probability of accurately initiating wide area protection is:

$$P_{sf} = \begin{cases} 0, S = 0 \\ \dfrac{\sum_{i=1}^{\Upsilon\delta} C_{S^0-i}^{S-1}}{C_{S^0}^{S}}, 0 < S < S^0 - \Upsilon\delta + 1 \\ 1, S^0 - \Upsilon\delta + 1 \leq S \leq S^0 \end{cases};$$

in the formula, $S^0 = \delta\mathrm{card}(U_{(1)}^+)$ is a theoretical quantity of bus sequence voltages uploaded by various substations in the regional power grid to the wide area monitoring center; $\delta$ is redundancy of information; the symbol card (g) is used for describing a cardinal number of a set; $S = \lfloor S^0 d \rfloor$ is an actual quantity of the bus sequence voltage information uploaded by various substations in the regional power grid and received by the wide area monitoring center, $S \in N$, and $S \propto d$; the symbol $\lfloor \ \rfloor$ is a floor function; $\Upsilon$ is a quantity of suspected fault buses.

After the step 204, also including:

206, using the set of the suspected fault buses and elements connected with outgoing lines of the suspected fault buses as a fault area ˆ;

207, determining a possible quantity set of bus sequence voltages corresponding to at least one port of each element in the fault area ˆ and being less than the preset bus sequence voltage initiation setting value; and 208, calculating the accuracy $p_{fc}(d)$ of the fault area positioning in combination with the information acceptance rate d, the theoretical quantity of bus sequence voltage information uploaded by various substations in the regional power grid to the wide area monitoring center and the possible quantity set of bus sequence voltages corresponding to at least one port of each element in the fault area ˆ and being less than the preset bus sequence voltage initiation setting value.

Specifically, including:

calculating the accuracy of fault area positioning through a third preset formula $$P_{fz} = \begin{cases} 0, & S = 0 \\ \dfrac{\sum_{i=1}^{\alpha\delta} C_{S^0-i}^{S-1}}{\sum_{i=1}^{\gamma\delta} C_{S^0-i}^{S-1}}, & 0 < S < S^0 - \alpha\delta + 1 \\ 1, & S^0 - \alpha\delta + 1 \le S \le S^0 \end{cases},$$

wherein, in the formula, $S^0 = \delta card(U_{(1)}^+)$ is the theoretical quantity of bus sequence voltage information uploaded by various substations in the regional power grid to the wide area monitoring center; $\delta$ is redundancy of information; the symbol card(g) is used for describing a cardinal number of a set; $S = \lfloor S^0 d \rfloor$ is an actual quantity of the bus sequence voltage information uploaded by various substations in the regional power grid and received by the wide area monitoring center, $S \in N$, and $S \propto d$; the symbol $\lfloor \; \rfloor$ is a floor function; $\alpha \in \{1, 2\}$ is the possible quantity set of bus sequence voltages corresponding to at least one port of each element in the fault area ˆ and being less than the preset bus sequence voltage initiation setting value.

It should be noted that after protection initiation succeeds, a smaller fault area is determined based on a certain rule in order to reduce the search range of failures, then on that basis, analysis on all direction element information of this area is highlighted to determine particular fault elements in this area. The disclosure stipulates that a bus i and all the outgoing lines thereof constitute one unit $\Lambda_i$. Principles adopted by a fault area positioning function and a protection initiation decision function is consistent in nature, and once the sequence voltage of a bus is discovered to be less than the preset initiation setting value, this bus area is regarded as a unit fault section. Accordingly, we may give a fault area positioning function:

$$\varpi(U_{(1)}) = \begin{cases} \Lambda, & h = 1 \\ NULL, & otherwise \end{cases};$$

in the formula, $$\Lambda = \{L, B\} = \bigcup_{i=1}^{r} \Lambda_i,$$

L is a set of electric power transmission lines within the fault area, B is a set of buses within the fault area, and all the bus sequence voltages within the fault area meet $|U_i| \le U_{set}$.

The single line failure may also trigger more than one bus voltage to meet initiation conditions. On the premise that the information acceptance rate is d, it is not ensured that the fault element is certainly present in an area ˆ positioned by the fault area positioning function because there is a possibility of losing the sequence voltage information, namely, a fault area positioning process has uncertainty. On the premise of protection initiation, the accuracy of fault area positioning is:

$$P_{fz} = \begin{cases} 0, & S = 0 \\ \dfrac{\sum_{i=1}^{\alpha\delta} C_{S^0-i}^{S-1}}{\sum_{i=1}^{\gamma\delta} C_{S^0-i}^{S-1}}, & 0 < S < S^0 - \alpha\delta + 1 \\ 1, & S^0 - \alpha\delta + 1 \le S \le S^0 \end{cases};$$

in the formula, $S^0 = \delta card(U_{(1)}^+)$ is the theoretical quantity of bus sequence voltage information uploaded by various substations in the regional power grid to the wide area monitoring center; $\delta$ is redundancy of information; the symbol card(g) is used for describing a cardinal number of a set; $S = \lfloor S^0 d \rfloor$ is an actual quantity of the bus sequence voltage information uploaded by various substations in the area power grid and received by the wide area monitoring center, $S \in N$, and $S \propto d$; the symbol $\lfloor \; \rfloor$ is a floor function; $\alpha \in \{1, 2\}$ is the possible quantity set of bus sequence voltages corresponding to at least one port of each element in the fault area ˆ and being less than the preset bus sequence voltage initiation setting value. The above formula represents that it is ensured that only when at least one of bus sequence voltage information associated to two ends of the fault element can be received by the monitoring center, the fault area positioning succeeds.

After the step 206, also including:

209, acquiring the theoretical quantity $Q^0$ of power direction information uploaded by all the suspected fault elements in the fault area ˆ to the wide area monitoring center; and 210, calculating the accuracy $p_{fc}(d)$ of recognizing the fault elements in the fault area ˆ in combination with the information acceptance rate d and the theoretical quantity $Q^0$ of power direction information uploaded by all the suspected fault elements in the fault area ˆ to the wide area monitoring center.

Specifically, including:

calculating the accuracy of recognizing fault elements in the fault area ˆ through a fourth formula $$P_{fc} = \begin{cases} 0, & 0 \le Q < 2 \\ 1 - \dfrac{2\sum_{i=0}^{Q} C_\delta^i C_{Q^0-2\delta}^{Q-i} - C_{Q^0-2\delta}^{Q}}{C_{Q^0}^{Q}}, & 2 \le Q < \delta \\ 1 - \dfrac{2\sum_{i=0}^{\delta} C_\delta^i C_{Q^0-2\delta}^{Q-i} - C_{Q^0-2\delta}^{Q}}{C_{Q^0}^{Q}}, & \delta \le Q \le Q^0 - 2\delta \\ 1 - \dfrac{2\sum_{i=\beta}^{\delta} C_\delta^i C_{Q^0-2\delta}^{Q-i}}{C_{Q^0}^{Q}}, & Q^0 - 2\delta < Q \le Q^0 - \delta \\ 1, & Q^0 - \delta < Q \le Q^0 \end{cases},$$

wherein, in the formula, $Q^0 = n\delta card(C)$ is the theoretical quantity of power direction information uploaded by all the suspected fault elements in the fault area ˆ to the wide area monitoring center, and n is a number of ports of suspected fault elements; δ is redundancy of information; the card(g) is used for describing a cardinal number of a set of suspected fault elements; $Q=\lfloor Q^0 d \rfloor$ is an actual quantity of power direction information uploaded by all the suspected fault elements and received by the wide area monitoring center, and the symbol $\lfloor \ \rfloor$ is a floor function; $\beta=Q-(Q_0-2\delta)$.

It should be noted that after the fault area ˆ is determined, it is only needed to complete specific fault element recognition within this area. Based on a direction comparison type protection principle, when power directions of various ends of the suspected fault element are all positive directions, a failure within the area is generated, or else, a failure outside the area is generated. Accordingly, a fault element recognition algorithm may be given:

$$\eta(\Phi) = \begin{cases} C_i, & \text{if}[D(\varphi_{C_i}^+) \cap D(\varphi_{C_i}^-) = 1] \\ 0, & \text{otherwise} \end{cases} ; C_i \in \Lambda,$$

wherein, $\varphi_{L_i}^+$, $\varphi_{L_i}^-$ and are power direction angles of a reception end and a transmission end of the suspected fault element, $$D(\varphi) = \begin{cases} 1, & \text{if } \varphi \in (90°, 270°] \\ 0, & \text{if } \varphi \in (-90°, 90°] \end{cases}$$

is a discriminant with a power direction being a positive direction or a negative direction, $$\varphi = \arg \frac{\dot{U}_{(1)}}{\dot{I}_{(1)} Z_d}$$

is a calculation formula of a power direction angle $\varphi$, $\dot{U}_{(1)}$ and $\dot{I}_{(1)}$ are respectively fault components of a measurement voltage and current of the suspected fault element, and $Z_d$ is a simulation impedance.

It can be seen from the fault element recognition function that once direction angles of two ends of the suspected fault element in the fault area meet a homodromous logic relationship, it is judged that the suspected fault element is a fault element.

If the current information acceptance rate of the wide area communication network is d, it is further proposed that a necessary and sufficient condition for recognizing the fault element is that power direction information of various ports of the suspected fault element cannot be lacked, thereby determining key information of all the suspected fault elements in the fault area ˆ.

Accordingly, we can give a calculation formula of an accuracy of recognizing the fault element in the fault area ˆ:

$$P_{fc} = \begin{cases} 0, & 0 \leq Q < 2 \\ 1 - \dfrac{2\sum_{i=0}^{Q} C_\delta^i C_{Q^0-2\delta}^{Q-i} - C_{Q^0-2\delta}^Q}{C_{Q^0}^Q}, & 2 \leq Q < \delta \\ 1 - \dfrac{2\sum_{i=0}^{\delta} C_\delta^i C_{Q^0-2\delta}^{Q-i} - C_{Q^0-2\delta}^Q}{C_{Q^0}^Q}, & \delta \leq Q \leq Q^0 - 2\delta \\ 1 - \dfrac{2\sum_{i=\beta}^{\delta} C_\delta^i C_{Q^0-2\delta}^{Q-i}}{C_{Q^0}^Q}, & Q^0 - 2\delta < Q \leq Q^0 - \delta \\ 1, & Q^0 - \delta < Q \leq Q^0 \end{cases},$$

in the formula, $Q^0=n\delta\text{card}(C)$ is the theoretical quantity of power direction information uploaded by all the suspected fault elements in the fault area ˆ to the wide area monitoring center, and n is a number of ports of suspected fault elements; δ is redundancy of information; the symbol card (g) is used for describing a cardinal number of a set of suspected fault elements; $Q=\lfloor Q^0 d \rfloor$ is an actual quantity of power direction information uploaded by all the suspected fault elements and received by the wide area monitoring center, and the symbol $\lfloor \ \rfloor$ is a floor function; $\beta=Q-(Q_0-2\delta)$.

The suspected fault element includes subjects such as a line and a three-winding transformer. When the suspected fault element is the line, n=2; when the suspected fault element is the three-winding transformer, n=3, and so forth $p_{fc}(d)$.

211, multiplying the accuracy $p_{sf}(d)$ of wide area protection initiation, the accuracy $p_{fz}(d)$ of fault area positioning and the accuracy $p_{fc}(d)$ of fault element recognition to obtain the decision accuracy $P_{dmp}$ of the wide area protection system.

It should be noted that the decision accuracy of the wide area protection system is $P_{dmp}=P_{sf}(d) \cdot P_{fz}(d) \cdot P_{fc}(d)$.

212, acquiring the accuracy $P_{sub}^i$ of an action of a relay protection device of the $i^{th}$ substation in a regional power grid during steady-state operation; and 213, calculating to obtain the probability $p_{act}$ of the reliable action of the wide area protection system according to the first present formula $$P_{act} = P_{dmp} \prod_i p_{sub}^i.$$

It should be noted that after the accuracy $P_{sub}^i$ of the action of the relay protection device of the $i^{th}$ substation in a regional power grid during steady-state operation is acquired, under the current network scenario, the probability of the reliable action of the wide area protection system is $$P_{act} = P_{dmp} \prod_i p_{sub}^i$$

when a power system element failure occurs, wherein, i is a corresponding substation needing to be tripped under the wide area protection system when the failure occurs.

When the failure occurs in the power system, we hope that the system has a higher probability of correctly recognizing and isolating the failure element to maintain the stability of the power system, such a protection system may be available. The present application holds that the wide area protection system is available only when the index reaches 90% or more, or else, the system is unavailable. The average available lasting time of the system is $$MAT = \frac{1}{b_{01}},$$

in the formula, $b_{01}$ is a transfer rate of a system transferring from an available state to an unavailable state.

The above is description of another embodiment of a method for reliability assessment of a wide area protection system. One embodiment of a device for reliability assessment of a wide area protection system will be described below.

Figure 3:
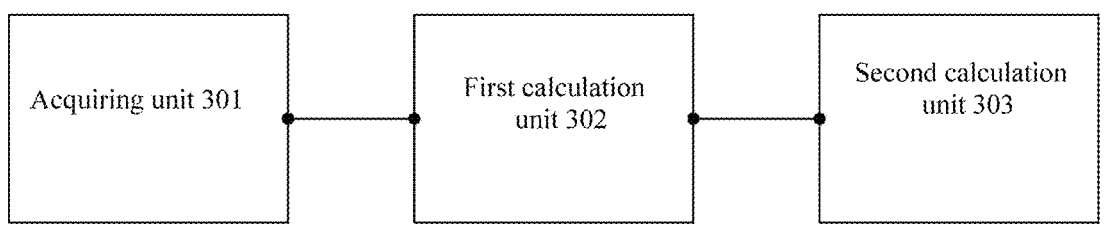
FIG. 3 is a flow chart of an embodiment of a device for reliability assessment of a wide area protection system according to the disclosure.

Referring to FIG. 3, the disclosure provides a device for reliability assessment of a wide area protection system according to one embodiment, includes:

an acquiring unit 301 configured to acquire an information acceptance rate d of a wide area monitoring center of a wide area protection system;

a first calculation unit 302 configured to obtain the accuracy $p_{sf}(d)$ of wide area protection initiation, the accuracy $p_{fz}(d)$ of fault area positioning and the accuracy $P_{fc}(d)$ of fault element recognition according to the information acceptance rate d; and a second calculation unit 303 configured to multiply the accuracy $p_{sf}(d)$ of wide area protection initiation, the accuracy $p_{sf}(d)$ of fault area positioning and the accuracy $p_{fc}(d)$ of fault element recognition to obtain the decision accuracy $P_{dmp}$ of the wide area protection system.

Those skilled in the art can clearly know that, for convenience and concision of the description, the specific working processes of the above described system, device and units can refer to corresponding processes in the previous method embodiments, and are not repeatedly described herein.

In several embodiments provided by the present application, it should be understood that the disclosed system, device and method can be achieved through other manners. For example, the above described device embodiment is only illustrative; for example, the division of the unit is only a logic function division, and there is another division manner when in actual achievement; for example, multiple units or assemblies can be combined or integrated into another system, or some features can be ignored, or not performed. On the other hand, the displayed or discussed mutual coupling or direct coupling or communication connection can be indirect coupling or communication connection between some interfaces, devices or units, and can be in electrical, mechanical and other forms.

The unit described as a separation part can be or cannot be physically separated, a part as a display unit can be or cannot be a physical unit, namely, can be located at one place, or can be distributed to multiple network units. Parts or all of units can be selected according to actual demand to achieve the purpose of the solution of this embodiment.

In addition, functional units in various embodiments of the disclosure can be integrated into one processing unit, or, various units can be individually and physically present, or, two or more than two units are integrated into one unit. The above integrated unit can be achieved by adopting a hardware form or a software functional unit form.

The integrated unit can be stored in a computer readable memory medium if being sold or used in the software functional unit form and as an independent product. Based on such understanding, the technical solutions of the disclosure in essence or parts or all of the technical solutions contributing to the prior art can be embodied in the form of a software product. The computer software product is stored in a memory medium, including several instructions for allowing a computer device (a personal computer, a server, or a network device, etc) to perform all or partial steps of various embodiments of the disclosure. The previous memory medium includes media, such as a U disk, a mobile hard disk, a Read-Only Memory (ROM), a Random Access Memory (RAM), a disk or an optical disk, which can store program codes.

According to the above description, the above embodiments are only used for explaining the technical solution of the disclosure but not limited thereto; although the disclosure is described in detail with reference to the previous embodiments, those of ordinary skill in the art should understand that they still can make amendments to the technical solutions described in various above-mentioned embodiments, or equivalent substitution is made to partial technical features; these amendments or substitutions do not make natures of the corresponding technical solutions depart from the spirit and scope of the technical solutions of various embodiments of the disclosure.

We claim:

1. A method for reliability assessment of a wide area protection system, comprising:
    S1, acquiring an information acceptance rate d of a wide area monitoring center of the wide area protection system;
    S2, obtaining an accuracy $p_{sf}(d)$ of wide area protection initiation, an accuracy $p_{fz}(d)$ of fault area positioning and an accuracy $p_{fc}(d)$ of fault element recognition according to the information acceptance rate d; and
    S3, multiplying the accuracy $p_{sf}(d)$ of wide area protection initiation, the accuracy $p_{fz}(d)$ of fault area positioning and an accuracy $p_{fc}(d)$ of fault element recognition to obtain a decision accuracy $P_{dmp}$ of the wide area protection system.

2. The method for reliability assessment of a wide area protection system of claim 1, after the step S3, also comprising:
    S4, acquiring an accuracy $P_{sub}^{i}$ of the action of the relay protection device of an $i^{th}$ substation in the regional power grid during steady-state operation; and
    S5, combining the decision accuracy $P_{dmp}$ of the wide area protection system and the accuracy $P_{sub}^{i}$ of an action of a relay protection device of an $i^{th}$ substation in a regional power grid during steady-state operation, and calculating to obtain a probability $P_{act}$ of a reliable action of the wide area protection system.

3. The method for reliability assessment of a wide area protection system of claim 2, wherein, the step S5 further comprises:
    calculating through a first preset formula $$P_{act} = P_{dmp} \prod_{i} p_{sub}^{i}$$

to obtain the probability $P_{act}$ of the reliable action of the wide area protection system.

4. The method for reliability assessment of a wide area protection system of claim 1, wherein, the step S2 specifically comprises:

S21, acquiring a theoretical quantity of bus sequence voltage information uploaded by various substations in a regional power grid to a wide area monitoring center;

S22, acquiring a set of bus sequence voltages received by the wide area monitoring center and uploaded by various substations in the regional power grid;

S23, determining a set of suspected fault buses, whose sequence voltages are less than a preset bus sequence voltage initiation setting value, in the set of bus sequence voltages received by the wide area monitoring center according to the preset bus sequence voltage initiation setting value in the wide area monitoring center, and accounting a quantity of suspected fault buses; and S24, calculating the accuracy $p_{sf}(d)$ of wide area protection initiation in combination with the information acceptance rate d, the theoretical quantity of bus sequence voltage information uploaded by the various substations in the regional power grid to the wide area monitoring center and the quantity of the suspected fault buses.

5. The method for reliability assessment of a wide area protection system of claim 4, after the step S23, also comprising:

S25, using the set of the suspected fault buses and elements connected with outgoing lines of the suspected fault buses as a fault area ˆ;

S26, determining the possible quantity set of bus sequence voltages corresponding to at least one port of each element in the fault area ˆ and being less than the preset bus sequence voltage initiation setting value; and S27, calculating the accuracy $p_{fz}(d)$ the fault area positioning in combination with the information acceptance rate d, the theoretical quantity of bus sequence voltage information uploaded by the various substations in the regional power grid to the wide area monitoring center and the possible quantity set of bus sequence voltages corresponding to at least one port of each element in the fault area ˆ and being less than the preset bus sequence voltage initiation setting value.

6. The method for reliability assessment of a wide area protection system of claim 5, after the step S25, also comprising:

S28, acquiring the theoretical quantity $Q^0$ of power direction information uploaded by all suspected fault elements in the fault area ˆ to the wide area monitoring center; and S29, calculating the accuracy $p_{fc}(d)$ of recognizing the fault elements in the fault area ˆ in combination with the information acceptance rate d and the theoretical quantity $Q^0$ of power direction information uploaded by all the suspected fault elements in the fault area ˆ to the wide area monitoring center.

7. The method for reliability assessment of a wide area protection system of claim 6, wherein, the step S24 specifically comprises:

calculating the accuracy of wide area protection initiation through a second preset formula $$P_{sf} = \begin{cases} 0, & S = 0 \\ \dfrac{\sum_{i=1}^{\Upsilon\delta} C_{S^0-i}^{S-1}}{C_{S^0}^{S}}, & 0 < S < S^0 - \Upsilon\delta + 1 \\ 1, & S^0 - \Upsilon\delta + 1 \leq S \leq S^0 \end{cases}$$

wherein, in the second preset formula, $S^0 = \delta\mathrm{card}(U_{(1)}^+)$ is the theoretical quantity of bus sequence voltage information uploaded by various substations in the regional power grid to the wide area monitoring center; δ is redundancy of information; a symbol card(g) is used for describing a cardinal number of a set; $S = \lfloor S^0 d \rfloor$ is an actual quantity of the bus sequence voltage information uploaded by various substations in the regional power grid and received by the wide area monitoring center, $S \in N$, and $S \propto d$; the symbol $\lfloor \ \rfloor$ is a floor function; Y is a quantity of suspected fault buses.

8. The method for reliability assessment of a wide area protection system of claim 7, wherein, the step S27 specifically comprises:

calculating the accuracy of fault area positioning through a third preset formula $$P_{fz} = \begin{cases} 0, & S = 0 \\ \dfrac{\sum_{i=1}^{\alpha\delta} C_{S^0-i}^{S-1}}{\sum_{i=1}^{\Upsilon\delta} C_{S^0-i}^{S-1}}, & 0 < S < S^0 - \alpha\delta + 1 \\ 1, & S^0 - \alpha\delta + 1 \leq S \leq S^0 \end{cases}$$

wherein, in the third preset formula, $S^0 = \delta\mathrm{card}(U_{(1)}^+)$ is the theoretical quantity of bus sequence voltage information uploaded by various substations in the regional power grid to the wide area monitoring center; δ is redundancy of information; the symbol card(g) is used for describing the cardinal number of a set; $S = \lfloor S^0 d \rfloor$ is the actual quantity of the bus sequence voltage information uploaded by various substations in the regional power grid and received by the wide area monitoring center, $S \in N$, and $S \propto d$; a symbol $\lfloor \ \rfloor$ is a floor function; $\alpha \in \{1, 2\}$ is the possible quantity set of bus sequence voltages corresponding to at least one port of each element in the fault area ˆ and being less than the preset bus sequence voltage initiation setting value.

9. The method for reliability assessment of a wide area protection system of claim 8, wherein, the step S29 specifically comprises:

calculating the accuracy of recognizing fault elements in the fault area ˆ through a fourth formula $$P_{fc} = \begin{cases} 0, & 0 \le Q < 2 \\ 1 - \dfrac{2\sum_{i=0}^{Q} C_\delta^i C_{Q^0-2\delta}^{Q-i} - C_{Q^0-2\delta}^{Q}}{C_{Q^0}^Q}, & 2 \le Q < \delta \\ 1 - \dfrac{2\sum_{i=0}^{\delta} C_\delta^i C_{Q^0-2\delta}^{Q-i} - C_{Q^0-2\delta}^{Q}}{C_{Q^0}^Q}, & \delta \le Q \le Q^0 - 2\delta \\ 1 - \dfrac{2\sum_{i=\beta}^{\delta} C_\delta^i C_{Q^0-2\delta}^{Q-i}}{C_{Q^0}^Q}, & Q^0 - 2\delta < Q \le Q^0 - \delta \\ 1, & Q^0 - \delta < Q \le Q^0 \end{cases},$$

wherein, $Q^0 = n\delta\,\mathrm{card}(C)$ is the theoretical quantity of power direction information uploaded by all the suspected fault elements in the fault area ^ to the wide area monitoring center, and n is a number of ports of suspected fault elements; δ is redundancy of information; the card(g) is used for describing the cardinal number of a set of suspected fault elements; $Q = \lfloor Q^0 d \rfloor$ is the actual quantity of power direction information uploaded by all the suspected fault elements and received by the wide area monitoring center, and the symbol $\lfloor\ \rfloor$ is a floor function; $\beta = Q - (Q_0 - 2\delta)$.

10. A device for reliability assessment of a wide area protection system, comprising:
an acquiring unit configured to acquire an information acceptance rate d of a wide area monitoring center of a wide area protection system;
a first calculation unit configured to obtain an accuracy $p_{sf}(d)$ of wide area protection initiation, an accuracy $p_{fz}(d)$ of fault area positioning and an accuracy $p_{fc}(d)$ of fault element recognition according to the information acceptance rate d; and
a second calculation unit configured to multiply an accuracy $p_{sf}(d)$ of wide area protection initiation, an accuracy $p_{fz}(d)$ of fault area positioning and an accuracy $p_{fc}(d)$ of fault element recognition to obtain the decision accuracy $P_{dmp}$ of the wide area protection system.

* * * * *